United States Patent
Kim et al.

(10) Patent No.: US 11,114,472 B2
(45) Date of Patent: Sep. 7, 2021

(54) THIN FILM TRANSISTOR PANEL, DISPLAY DEVICE, AND METHOD OF MANUFACTURING THE THIN FILM TRANSISTOR PANEL

(71) Applicant: Samsung Display Co., Ltd., Yongin-Si (KR)

(72) Inventors: Byeong Beom Kim, Asan-si (KR); Heon Sik Ha, Hwaseong-si (KR); Jin Ho Hwang, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/653,916

(22) Filed: Oct. 15, 2019

(65) Prior Publication Data

US 2020/0203388 A1    Jun. 25, 2020

(30) Foreign Application Priority Data

Dec. 20, 2018    (KR) .................. 10-2018-0166526

(51) Int. Cl.
*H01L 27/12* (2006.01)

(52) U.S. Cl.
CPC ...... *H01L 27/1229* (2013.01); *H01L 27/1218* (2013.01); *H01L 27/1262* (2013.01); *H01L 27/1274* (2013.01)

(58) Field of Classification Search
None
See application file for complete search history.

(56) References Cited

U.S. PATENT DOCUMENTS

| | | | |
|---|---|---|---|
| 2004/0159286 A1* | 8/2004 | Aoki | H01J 37/32633 118/723 E |
| 2009/0111244 A1* | 4/2009 | Yamazaki | B23K 26/083 438/458 |
| 2013/0109116 A1* | 5/2013 | Cavuoti | H01L 33/58 438/27 |
| 2016/0197197 A1* | 7/2016 | Jo | H01L 27/1274 257/72 |
| 2018/0069033 A1 | 3/2018 | Chen | |

FOREIGN PATENT DOCUMENTS

| | | | |
|---|---|---|---|
| KR | 2010-0073580 A | 7/2010 | |
| KR | 2016-0083994 A | 7/2016 | |
| WO | WO-2012156991 A2 * | 11/2012 | C03C 3/118 |

* cited by examiner

*Primary Examiner* — J. E. Schoenholtz
(74) *Attorney, Agent, or Firm* — Innovation Counsel LLP

(57) ABSTRACT

A transistor panel may include a substrate, a transistor, a first inorganic buffer layer, and an inorganic fluorine-containing buffer layer. The transistor may overlap the substrate and may include a semiconductor layer. The first inorganic buffer layer may be disposed between the substrate and the semiconductor layer. The inorganic fluorine-containing buffer layer may be disposed between the first inorganic buffer layer and the semiconductor layer and may contain fluorine in a range of 0.5 at % to 2 at %.

16 Claims, 14 Drawing Sheets

THIN FILM TRANSISTOR PANEL, DISPLAY DEVICE, AND METHOD OF MANUFACTURING THE THIN FILM TRANSISTOR PANEL

CROSS-REFERENCE TO RELATED APPLICATION

This application claims priority to and the benefit of Korean Patent Application No. 10-2018-0166526 filed on Dec. 20, 2018 in the Korean Intellectual Property Office; the contents of the Korean Patent application are incorporated herein by reference.

BACKGROUND

1. Technical Field

The technical field relates to a thin film transistor panel, a display device, and a method of manufacturing the thin film transistor panel.

2. Description of the Related Art

Thin film transistors (TFT) are used in various fields. In particular, they are used as switching and driving elements in a display device such as a liquid crystal display (LCD) or an organic light emitting diode (OLED) display.

A thin film transistor panel includes a substrate, a buffer layer on the substrate, and a thin film transistor on the buffer layer. The thin film transistor includes a gate electrode connected to a gate line, a source electrode connected to a data line, a drain electrode facing the source electrode, and a semiconductor layer electrically connected to the source electrode and the drain electrode.

Undesirable trapping may occur due to unstable coupling at an interface between the buffer layer and the semiconductor layer. As the trap density increases, an instantaneous afterimage may occur on a display device that includes the thin film transistor panel. As a result, the display quality of the display device may be undesirable.

SUMMARY

Embodiments may be related to a thin film transistor panel having a reduced trap density at an interface between a buffer layer and a semiconductor layer.

Embodiments may be related to a display device in which an instantaneous afterimage phenomenon is improved by controlling a trap density at an interface between a buffer layer and a semiconductor layer.

Embodiments may be related to a method of manufacturing a thin film transistor panel having a reduced trap density at an interface between a buffer layer and a semiconductor layer.

An embodiment of a thin film transistor panel includes a substrate, a buffer layer disposed on the substrate, and a thin film transistor disposed on the buffer layer, wherein the buffer layer includes a first inorganic buffer layer disposed on one surface of the substrate, and an inorganic fluorine buffer layer disposed on the first inorganic buffer layer and containing fluorine of 0.5 at % to 2 at %, and wherein the thin film transistor includes a semiconductor layer disposed on the inorganic fluorine buffer layer.

An embodiment of a display device includes a substrate, a silicon nitride film disposed on the substrate, a first silicon oxide film disposed on the silicon nitride film, a fluorine-containing inorganic film disposed on the first silicon oxide film and containing fluorine of 0.5 at % to 2 at %, the fluorine-containing inorganic film including SiOF or SiNF, and a silicon film disposed on the fluorine-containing inorganic film.

An embodiment of a method of manufacturing a thin film transistor panel includes the steps of forming a buffer layer on a substrate, and forming a semiconductor layer on the buffer layer, wherein the step of forming the buffer layer comprises forming a first inorganic buffer layer on the substrate, and forming an inorganic fluorine buffer layer containing fluorine of 0.5 at % to 2 at % on the first inorganic buffer layer.

An embodiment may be related to a transistor panel. The transistor panel may include a substrate, a transistor, a first inorganic buffer layer, and an inorganic fluorine-containing buffer layer. The transistor may overlap the substrate and may include a semiconductor layer. The first inorganic buffer layer may be disposed between the substrate and the semiconductor layer. The inorganic fluorine-containing buffer layer may be disposed between the first inorganic buffer layer and the semiconductor layer and may contain fluorine in a range of 0.5 at % to 2 at %.

The first inorganic buffer layer may include a silicon nitride film.

The transistor panel may include a second inorganic buffer layer interposed between the first inorganic buffer layer and the inorganic fluorine-containing buffer layer and including a silicon oxide film.

The transistor panel may include a third inorganic buffer layer interposed between the inorganic fluorine-containing buffer layer and the semiconductor layer and including a silicon oxide film.

The third inorganic buffer layer may be thinner than the second inorganic buffer layer in a direction perpendicular to the substrate.

At least one of the first inorganic buffer layer and the second inorganic buffer layer may contain fluorine. Each of a content of fluorine contained in the first inorganic buffer layer and a content of fluorine contained in the second inorganic buffer layer may be less than a content of fluorine contained in the inorganic fluorine-containing buffer layer.

The first inorganic buffer layer may be disposed directly on one surface of the substrate. The semiconductor layer may be disposed directly on one surface of the inorganic fluorine-containing buffer layer.

A concentration of the fluorine in the inorganic fluorine-containing buffer layer may decrease from a center of the inorganic fluorine-containing buffer layer toward at least one of the substrate and the semiconductor layer in a thickness direction.

The inorganic fluorine-containing buffer layer may include SiOF or SiNF.

The semiconductor layer may include polycrystalline silicon.

The substrate may include glass containing an alkali metal oxide component.

An embodiment may be related to a display device. The display device may include the following elements: a substrate; a silicon nitride film disposed on the substrate; a first silicon oxide film disposed on the silicon nitride film; a fluorine-containing inorganic film disposed on the first silicon oxide film, containing fluorine in a range of 0.5 at % to 2 at %, and including SiOF or SiNF; and a silicon film disposed on the fluorine-containing inorganic film. The fluorine-containing inorganic film may be disposed between the silicon film and at least one of the substrate, the silicon nitride film, and the first silicon oxide film.

The silicon film may include polycrystalline silicon. The substrate may include glass containing an alkali metal oxide component.

Among the silicon nitride film, the first silicon oxide film, and the fluorine-containing inorganic film, the fluorine-containing inorganic film has a maximum content of fluorine.

The display device may include a second silicon oxide film disposed between the fluorine-containing inorganic film and the silicon film.

An embodiment may be related to a method of manufacturing a thin film transistor panel. The method may include the following steps: forming a first inorganic buffer layer on a substrate; forming an inorganic fluorine-containing buffer layer on the first inorganic buffer layer, wherein the inorganic fluorine-containing buffer layer may contain fluorine in a range of 0.5 at % to 2 at %; and forming a semiconductor layer on the inorganic fluorine-containing buffer layer. The inorganic fluorine-containing buffer layer may be disposed between the first inorganic buffer layer and the semiconductor layer.

The method may include forming a second inorganic buffer layer after forming the first inorganic buffer layer and before forming the inorganic fluorine-containing buffer layer. The first inorganic buffer layer may include a silicon nitride film. The second inorganic buffer layer may include a silicon oxide film.

The step of forming the inorganic fluorine-containing buffer layer may include forming a film using a reaction gas containing $SiF_4$ and $SiH_4$.

The step of forming the second inorganic buffer layer and the step of forming the inorganic fluorine-containing buffer layer may be performed in the same chamber.

The step of forming the semiconductor layer may include the following sub-steps: forming an amorphous silicon layer on the inorganic fluorine-containing buffer layer, and crystallizing the amorphous silicon layer to form a polycrystalline silicon layer.

According to embodiments, instantaneous afterimages may be prevented or minimized by controlling the trap density at the interface between a buffer layer and a semiconductor layer in a display device. Advantageously, satisfactory image display quality of the display device may be attained.

DETAILED DESCRIPTION OF EMBODIMENTS

Figure 1:
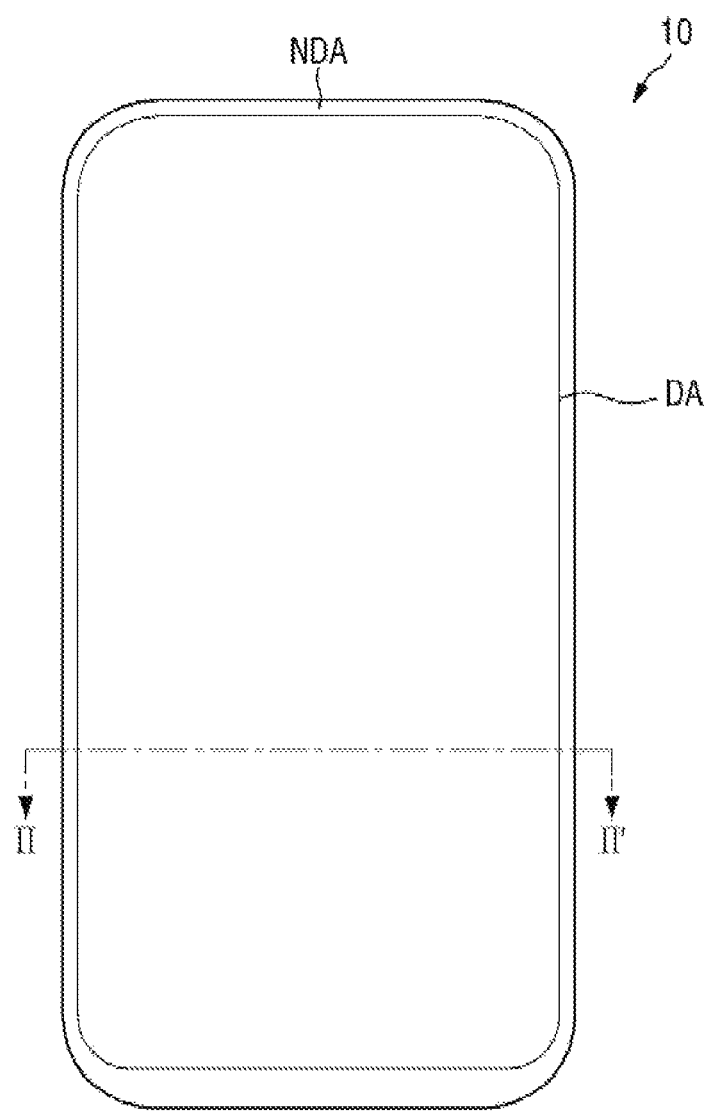
FIG. 1 is a plan view of a display device according to an embodiment.

Example embodiments are described with reference to the accompanying drawings. Practical embodiments may be embodied in many different forms and should not be construed as being limited to the described embodiments.

Like reference numerals may refer to like elements in the specification.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on," "connected to," or "coupled to" a second element, the first element can be directly on, directly connected to, or directly coupled to the second element, or one or more intervening elements may be present between the first element and the second element. When a first element is referred to as being "directly on," "directly connected to," or "directly coupled to" a second element, there are no intended intervening elements (except environmental elements such as air) disposed or connected between the first element and the second element.

The term "connect" may mean "electrically connect." The term "insulate" may mean "electrically insulate." The term "buffer layer" may mean "buffer layer set." The term "surface" may mean "face."

Figure 2:
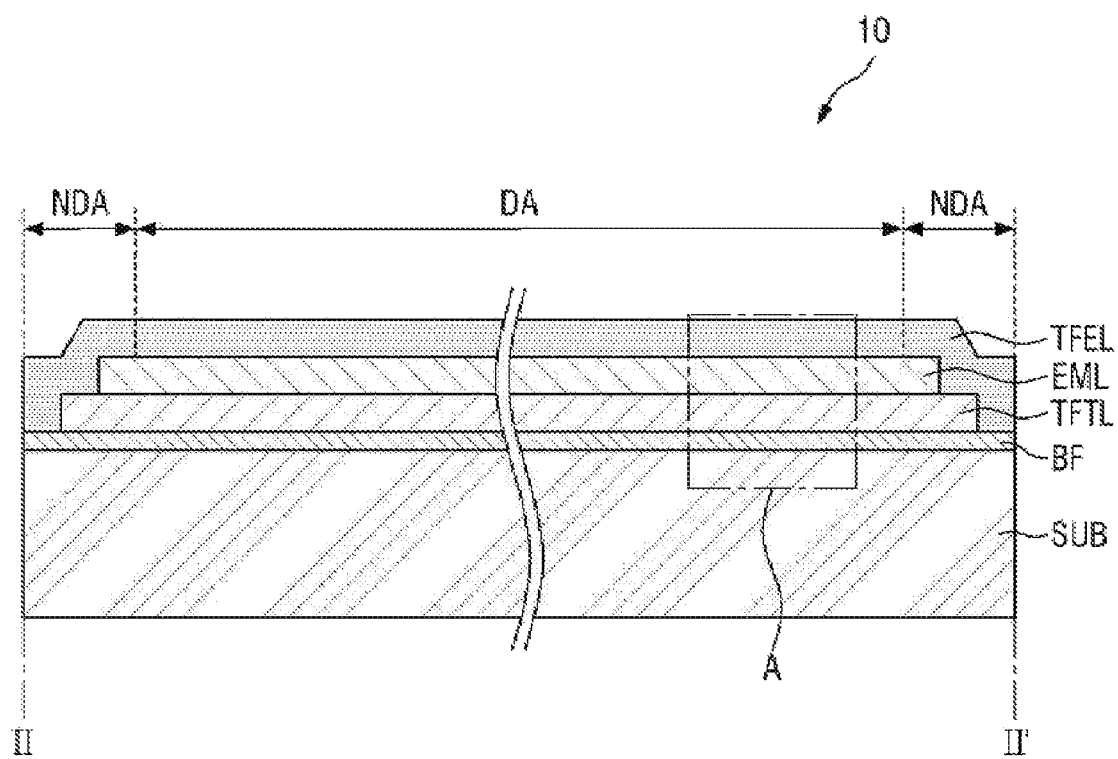
FIG. 2 is a cross-sectional view taken along line II-IT of FIG. 1 according to an embodiment.
Figure 3:
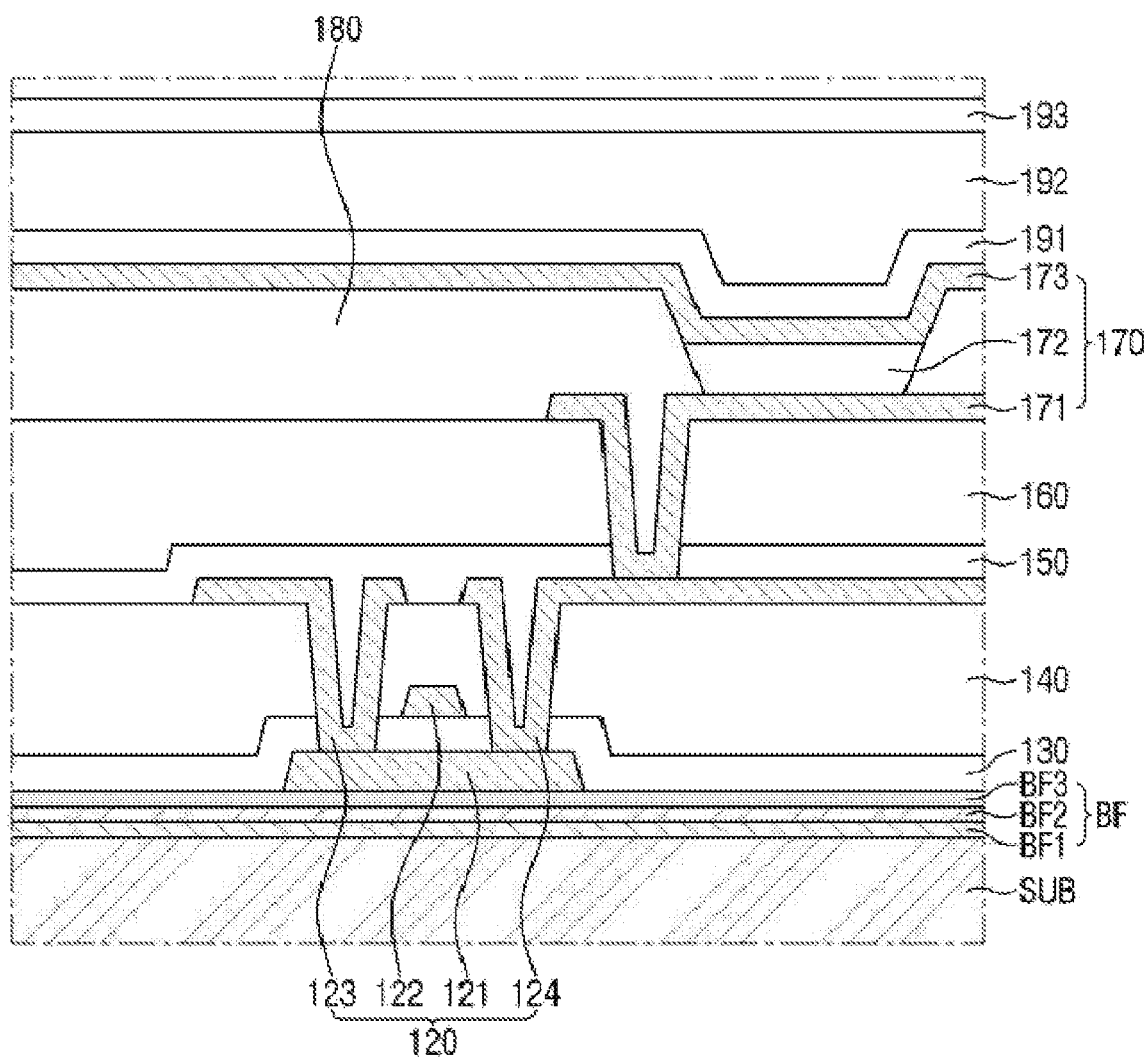
FIG. 3 is a cross-sectional view of region A of FIG. 2 according to an embodiment.
Figure 4:
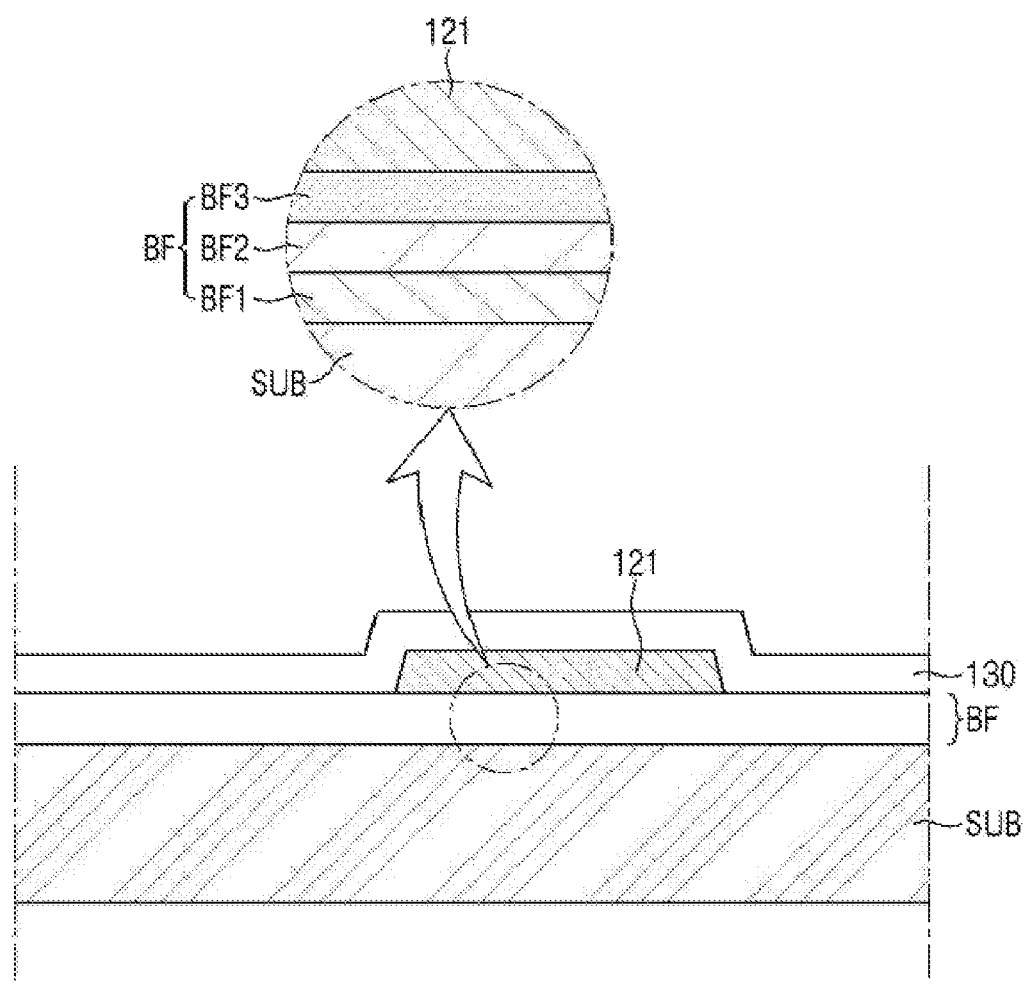
FIG. 4 is a cross-sectional view schematically showing a thin film transistor panel according to an embodiment.

FIG. 1 is a plan view of a display device according to an embodiment. FIG. 2 is a cross-sectional view taken along line II-II' of FIG. 1 according to an embodiment. FIG. 3 is a cross-sectional view of region A of FIG. 2 according to an embodiment. FIG. 4 is a cross-sectional view schematically showing a thin film transistor panel according to an embodiment.

Referring to FIGS. 1 to 4, a display device 10 may provide a display screen for an electronic device, such as a laptop computer, a monitor, an Internet of Things (IoT) device, a mobile phone, a smart phone, a tablet personal computer, a smart watch, or a watch phone.

The display device 10 may be/include at least one of an organic light emitting display device, a liquid crystal display device, a plasma display device, a field emission display device, an electrophoretic display device, an electrowetting display device, a quantum dot light emitting display device, and a micro LED display device. In an embodiment, the display device 10 is an organic light emitting display device.

The display device 10 may include a display area DA in which pixels are formed to display an image and may include a non-display area NDA which is a peripheral area of the display area DA.

In the display area DA, in addition to the pixels, scan lines, data lines and power supply lines connected to the pixels may be arranged. The non-display area NDA may be defined as an area from the outside of the display area DA to the edge of the display panel.

The display device 10 may include a substrate SUB and a thin film transistor 120 for driving a pixel. The thin film transistor 120 may overlap the substrate SUB and may include a gate electrode 122, a source electrode 123, a drain electrode 124, and a semiconductor layer 121. The gate electrode 122 of the thin film transistor 120 may be connected to a scan line (not shown), and the scan line may receive a scan signal from a scan driver (not shown) disposed in the non-display area NDA. The source electrode 123 of the thin film transistor 120 may be connected to a data line (not shown) and may receive a data signal from a data driver (not shown) disposed in the non-display area NDA. The drain electrode 124 of the thin film transistor 120 may be connected to a first electrode 171 of the associated pixel.

The display device 10 may include a light emitting element 170 connected to the thin film transistor 120. The light emitting element 170 may include the first electrode 171, an organic light emitting layer 172, and a second electrode 173. The second electrode 173 may be a common electrode that spans multiple pixels. The light emitting element 170 may be an organic light emitting diode.

Referring to FIGS. 2 to 4, the display device 10 includes a substrate SUB, a buffer layer BF disposed on the substrate SUB, a thin film transistor layer TFTL disposed on the buffer layer BF, a light emitting element layer EML disposed on the thin film transistor layer TFTL and a thin film encapsulation layer TFEL disposed on the light emitting element layer EML.

The substrate SUB may include glass. The substrate SUB may include an alkali glass containing an alkali metal oxide component such as sodium, potassium or the like. For example, the substrate SUB may include aluminosilicate, alumino-borosilicate, barium-borosilicate, or the like.

When the substrate SUB includes an alkali metal oxide component such as sodium (Na), potassium (K), or the like, alkali metal ions (e.g., Na+, K+) may be diffused from the substrate SUB to a peripheral layer (e.g., the buffer layer BF or the semiconductor layer 121). Without the buffer layer BF, diffused alkali metal ions may penetrate the semiconductor layer 121 of the thin film transistor 120 and may change the electrical characteristics of the thin film transistor 120. Since the buffer layer BF containing fluorine ions is disposed between the substrate SUB and the semiconductor layer 121, penetration of alkali metal ions can be sufficiently blocked.

The substrate SUB may include polymer resin. Examples of the polymeric material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination of some of the aforementioned materials.

When the substrate SUB is made of glass, the substrate SUB may be a rigid substrate. When the substrate SUB is made of thin glass which can be bent or polymer resin such as polyimide (PI), the substrate SUB may be used as a flexible substrate capable of being bent, folded or rolled.

The buffer layer BF may be disposed on the substrate SUB. The buffer layer BF functions to smooth the surface of the substrate SUB, to prevent impurities diffused from the substrate SUB from penetrating into the thin film, and to block moisture or outside air. In addition, the buffer layer BF can prevent alkali metal ions or the like diffused from the substrate SUB from being transferred to the semiconductor layer 121.

In one embodiment, the buffer layer BF may include a plurality of inorganic films which are stacked. Each of the inorganic films constituting the buffer layer BF may be, for example, a silicon oxide (SiOx) film, a silicon nitride (SiNx) film, a silicon oxynitride (SiON) film, or the like.

The thin film transistor layer TFTL may be disposed on the buffer layer BF. The thin film transistor layer TFTL may include the thin film transistor 120, the scan line (not shown), the data line (not shown), and the like, and may further include a power supply line (not shown).

The thin film transistor 120 includes the semiconductor layer 121, the gate electrode 122, the source electrode 123, and the drain electrode 124. The semiconductor layer 121 of the thin film transistor 120 is disposed on one surface of the buffer layer BF.

The semiconductor layer 121 forms a channel of the thin film transistor 120. In one embodiment, the semiconductor layer 121 may include a silicon material such as monocrystalline silicon, polycrystalline silicon, or amorphous silicon. Among the above-described crystalline materials, polycrystalline silicon may be preferred in consideration of the electrical and physical characteristics of the semiconductor and processability. For example, the polycrystalline silicon may be formed by depositing amorphous silicon on the substrate SUB or the buffer layer BF and then crystallizing the amorphous silicon. The polycrystalline silicon crystallization process may be accompanied by a heat treatment process such as furnace annealing, rapid thermal annealing, and/or laser annealing. In order to fabricate a polycrystalline silicon thin film having good crystallinity on the substrate SUB including glass, it is preferable to perform a low-temperature heat treatment process.

In an embodiment, the semiconductor layer 121 may include an oxide semiconductor including indium (In), zinc (Zn), gallium (Ga), or tin (Sn). In an embodiment, the semiconductor layer 121 is made of low temperature polysilicon (LTPS).

A gate insulating layer 130 may be disposed on the semiconductor layer 121. The gate insulating layer 130 may be formed of an inorganic layer, for example, a silicon nitride layer, a silicon oxynitride layer, a silicon oxide layer, a titanium oxide layer, or an aluminum oxide layer.

A gate electrode 122 and a gate line (not shown) may be disposed on the gate insulating layer 130. The gate electrode 122 and the gate line may include a single layer or multiple layers formed of at least one of molybdenum (Mo), aluminum (Al), chromium (Cr), gold (Au), titanium (Ti), nickel (Ni), neodymium (Nd), copper (Cu), and an alloy.

An interlayer insulating film 140 may be disposed on the gate electrode 122 and the gate line. The interlayer insulating film 140 may be/include an inorganic film, an organic film, and/or an organic-inorganic composite film. The interlayer insulating film 140 may include a stack of two or more insulating films such as organic-inorganic films.

A source electrode 123 and a drain electrode 124 may be disposed on the interlayer insulating layer 140. Each of the source electrode 123 and the drain electrode 124 may be connected to the semiconductor layer 121 through a contact hole passing through the gate insulating layer 130 and the interlayer insulating film 140. The source electrode 123 and the drain electrode 124 may include a single layer or multiple layers formed of at least one of titanium (Ti), aluminum (Al), chromium (Cr), gold (Au), nickel (Ni), neodymium (Nd), molybdenum (Mo), copper (Cu), and an alloy. In one embodiment, the source electrode 123 and the drain electrode 124 may include triple layers of Ti—Al—Ti.

A passivation layer 150 for protecting the thin film transistor 120 may be disposed on the source electrode 213 and the drain electrode 124. The passivation layer 150 may be formed of an inorganic layer, for example, a silicon nitride layer, a silicon oxynitride layer, a silicon oxide layer, a titanium oxide layer, or an aluminum oxide layer.

A planarization layer 160 may be disposed on the passivation layer 150 to planarize a step caused by the thin film transistor 120. The planarization layer 160 may be formed of an organic material such as acryl resin, epoxy resin, phenolic resin, polyamide resin, or polyimide resin.

The light emitting element layer EML may be disposed on the thin film transistor layer TFTL. The light emitting element layer EML may include the light emitting element 170 and a pixel defining layer 180.

The light emitting element 170 and the pixel defining layer 180 are formed on the planarization layer 160. The light emitting element 170 may include the first electrode 171, the organic light emitting layer 172, and the second electrode 173.

The first electrode 171 may be formed on the planarization layer 160. The first electrode 171 is connected to the drain electrode 124 of the thin film transistor 120 through a contact hole passing through the passivation layer 150 and the planarization layer 160.

In a top emission structure for emitting light from the second electrode 173, the first electrode 171 may be formed of a metal material having high reflectance, such as aluminum and titanium having a stacked structure of Ti—Al—Ti, aluminum and ITO having a stacked structure of ITO-Al-ITO, an APC alloy, and/or an APC alloy and ITO having a stacked structure of ITO-APC-ITO. The APC alloy is an alloy of silver (Ag), palladium (Pd), and copper (Cu).

In a bottom emission structure for emitting light from the first electrode 171, the first electrode 171 may be formed of a transparent conductive material such as ITO or IZO that can transmit light or may be formed of a semi-transmissive conductive material such as magnesium (Mg), silver (Ag), and/or an alloy of magnesium (Mg) and silver (Ag). The light emission efficiency can be increased by microcavities.

The pixel defining layer 180 may partially expose first electrodes 171 for R, G, and B pixels or sub-pixels. The pixel defining layer 180 may cover the edge of the first electrode 171. The pixel defining layer 180 may be formed of an organic material such as acryl resin, epoxy resin, phenolic resin, polyamide resin, or polyimide resin.

The organic light emitting layer 172 is formed on the first electrode 171 and inside an opening of the pixel defining layer 180. The organic light emitting layer 172 may emit light of a predetermined color and may include an organic material. The organic light emitting layer 172 may include a hole transporting layer, an organic material layer, and an electron transporting layer.

The second electrode 173 is formed on the organic light emitting layer 172. The second electrode 173 may cover the organic light emitting layer 172. The second electrode 173 may span multiple pixels P. A capping layer may be formed on the second electrode 173.

In a top emission (or front emission) structure, the second electrode 173 may be formed of a transparent conductive material such as ITO or IZO that can transmit light or may be formed of a semi-transmissive conductive material such as magnesium (Mg), silver (Ag), and/or an alloy of magnesium (Mg) and silver (Ag). When the second electrode 173 is formed of a semi-transmissive metal material, the light emission efficiency can be increased by microcavities.

In a bottom emission (or back emission) structure, the second electrode 173 may be formed of a metal material having high reflectance, such as aluminum and titanium having a stacked structure of Ti—Al—Ti, aluminum and ITO having a stacked structure of ITO-Al-ITO, an APC alloy, and/or an APC alloy and ITO having a stacked structure of ITO-APC-ITO. The APC alloy is an alloy of silver (Ag), palladium (Pd) and copper (Cu).

The thin film encapsulation layer TFEL may be disposed on the light emitting element layer EML. The thin film encapsulation layer TFEL serves to prevent oxygen or moisture from penetrating into the light emitting element layer EML. To this end, the thin film encapsulation layer TFEL may include at least one inorganic film, and may include an organic-inorganic composite film in which inorganic and organic films are alternately stacked. In one embodiment, the thin film encapsulation layer TFEL may include a first inorganic encapsulation film 191, an organic encapsulation film 192 disposed on the first inorganic encapsulation film 191, and a second inorganic encapsulation film 193 disposed on the organic encapsulation film 192.

The first inorganic encapsulation film 191 and the second inorganic encapsulation film 193 may include the same material. The first inorganic encapsulation film 191 and/or the second inorganic encapsulation film 193 may include polysiloxane, silicon nitride, silicon oxide, silicon oxynitride or the like.

The organic encapsulation film 192 may include at least one of a fluorine-based polymer compound including a polyimide-based compound, a polyacrylic compound, Teflon, a polyorganosiloxane compound, a benzocyclobutene compound, a phenol-based compound, an epoxy-based compound, a polyamide-based compound, a polyphenylene ether-based compound, and a polyphenylene sulfide-based compound.

Referring to FIG. 4, the buffer layer BF may include a first buffer layer BF1, a second buffer layer BF2 and a third buffer layer BF3.

The first buffer layer BF1 may be disposed on one surface of the substrate SUB and may be in direct contact with the substrate SUB. The second buffer layer BF2 may be stacked on one surface of the first buffer layer BF1 and may be in direct contact with the first buffer layer BF1.

Each of the first buffer layer BF1 and the second buffer layer BF2 may contain an inorganic material. In one embodiment, the first buffer layer BF1 disposed relatively close to the substrate SUB may be/include a silicon nitride (SiNx) film having an excellent effect of blocking alkali metal ions (Na+, K+). The second buffer layer BF2 disposed relatively close to the semiconductor layer 121 may be/include a silicon oxide (SiOx) film. Since the second buffer layer BF2 may be/include a silicon oxide (SiOx) film, it is possible to further facilitate the semiconductor layer crystallization step by utilizing latent heat in the film, and to prevent thermal damage of the substrate SUB potentially caused by the heat of the laser used in the crystallization step.

Since the first buffer layer BF1 may be/include a silicon nitride (SiNx) film, the first buffer layer BF1 may be a supply source of hydrogen gas. The silicon oxide (SiOx) film of the second buffer layer BF2 is effective in blocking the hydrogen gas flowing from the first buffer layer BF1 to prevent potential film burst.

A third buffer layer BF3 may be disposed on one surface of the second buffer layer BF2. One surface of the third buffer layer BF3 may be in direct contact with one surface of the second buffer layer BF2, and another surface of the third buffer layer BF3 may be in direct contact with one surface of the semiconductor layer 121.

The third buffer layer BF3 may be made of an inorganic material containing fluorine. The third buffer layer BF3 may include silicon oxide or silicon nitride containing fluorine. For example, the third buffer layer BF3 may include SiOF or SiNF.

As the third buffer layer BF3 contains fluorine, the trap density at the interface between the third buffer layer BF3 and the semiconductor layer 121 is minimized, for minimizing an instantaneous afterimage phenomenon of the display device 10.

Without the fluorine-containing third buffer layer BF3, a Si—H bond or a dangling bond may exist at the interface between the third buffer layer BF3 and the semiconductor layer 121. The Si—H bond, which is a weak bond, may easily break to form a dangling bond. The dangling bond itself is very unstable and may cause charge trapping such that carriers are caught. As the number of trap sites at the interface between the third buffer layer BF3 and the semiconductor layer 121 increases, the electron mobility decreases, resulting in a significant instantaneous afterimage, such that image display quality of the display device may be undesirable. In embodiments, the instantaneous afterimage phenomenon can be minimized or prevented by replacing the Si—H bond at the interface between the semiconductor layer 121 and the buffer layer BF with a stronger bond to control the trap density at the interface.

Since the third buffer layer BF3 contains fluorine, the fluorine in the third buffer layer BF3 may diffuse to the interface between the third buffer layer BF3 and the semiconductor layer 121, such that a Si—F bond may be formed instead of the Si—H bond at the interface between the third buffer layer BF3 and the semiconductor layer 121. As the relatively weak bond is replaced by the more stable Si—F bond, the number of trap sites at the interface can be reduced. The trap density, which interferes with the movement of carriers, can be reduced, and electron mobility can be improved to minimize the instantaneous afterimage phenomenon of the display device.

If fluorine contained in the third buffer layer BF3 is in an excessive amount, excess fluorine may diffuse to an adjacent layer. As a result, by-products such as hydrofluoric acid (HF) may be generated, and hydrofluoric acid (HF) (which is a strong acid) may adversely affect the device. Further, fluorine ions are coupled with H rather than Si of Si—H bonds to form hydrofluoric acid (HF), while dangling bonds are formed in Si, so that the dangling bond density at the interface can further increase. Thus, the trap density at the interface between the third buffer layer BF3 and the semiconductor layer 121 may increase, such that the instantaneous afterimage phenomenon may worsen.

Therefore, in order to reduce the trap density at the interface between the third buffer layer BF3 and the semiconductor layer 121, the fluorine content in the third buffer layer BF3 needs to be within an appropriate range.

In one embodiment, the fluorine content in the third buffer layer BF3 may be in a range of 0.5 at % to 2 at %. When the fluorine content in the third buffer layer BF3 is 0.5 at % or more, it is possible to effectively control the trap density by fluorine.

When the fluorine content in the third buffer layer BF3 is 2 at % or less, the number of trap sites is reduced while avoiding the formation of by-products such as hydrofluoric acid (BF), thereby preventing an interface defect between the buffer layer BF and the semiconductor layer 121. When the fluorine content in the third buffer layer BF3 exceeds 2 at %, the dangling bond density at the interface may further increase because the fluorine ions form dangling bonds in Si. Thus, the trap density at the interface between the third buffer layer BF3 and the semiconductor layer 121 may increase, such that the instantaneous afterimage phenomenon may worsen.

In some embodiments, the fluorine content in the third buffer layer BF3 may be in a range of 1 at % to 2 at %, or in a range of 1.5 at % to 2 at %.

In order to check an influence of the fluorine content in the third buffer layer BF3 on the instantaneous afterimage of the display device, the thickness (A) of the third buffer layer BF3, the flow rates (sccm) of $SiF_4$ and $SiH_4$ used in the formation of the third buffer layer BF3, the deposition rate (Å/sec) of the third buffer layer BF3, and the fluorine content (at %) of the third buffer layer BF3 were measured, and the instantaneous afterimage duration (sec) of the display device according to the fluorine content (at %) in the third buffer layer BF3 was measured. The results are shown in Table 1 below and in FIG. 5.

TABLE 1

| | $SiF_4$ (sccm) | $SiH_4$ (sccm) | Thickness (Å) | Deposition rate (Å/sec) | F content in third buffer layer (at %) | Instantaneous afterimage (sec) |
|---|---|---|---|---|---|---|
| Example 1 | 0 | 160 | 3447 | 59.4 | 0 | 13.8 |
| Example 2 | 30 | 160 | 3656 | 63.0 | 1.89 | 11.4 |
| Example 3 | 60 | 160 | 3822 | 65.9 | 2.27 | 14.3 |

Figure 5:
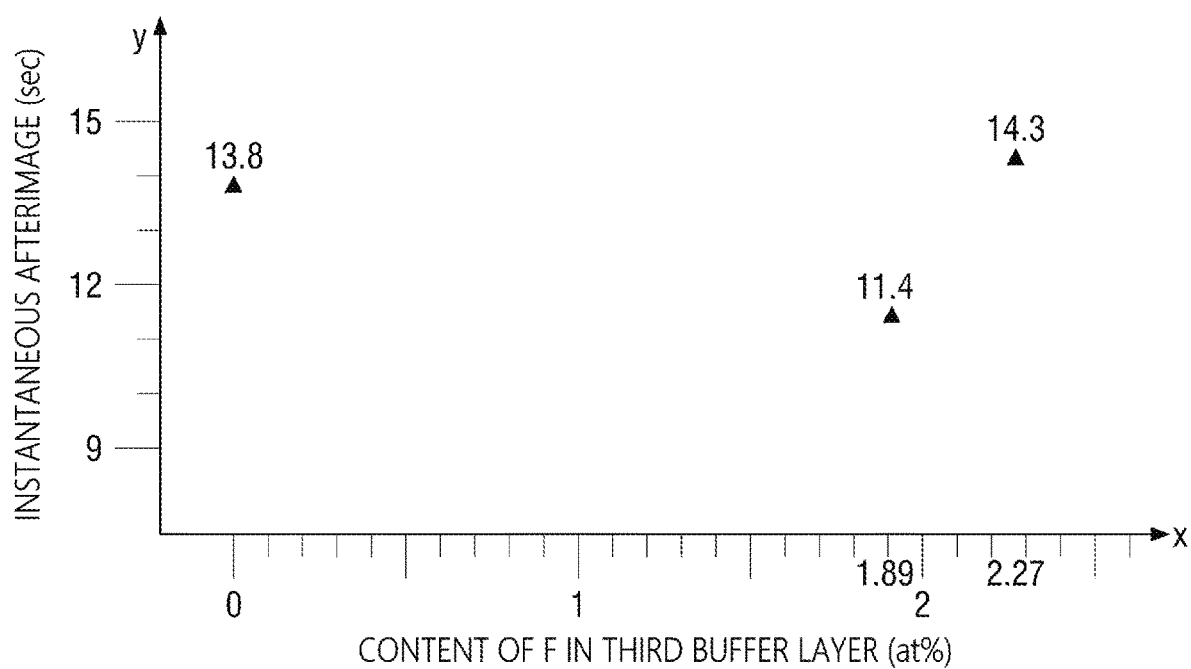
FIG. 5 is a graph representing the duration of an instantaneous afterimage of a display device including a thin film transistor panel according to an embodiment.

FIG. 5 is a graph representing the instantaneous afterimage duration of a display device including a thin film transistor panel according to an embodiment. In FIG. 5, the x-axis represents the fluorine content (at %) in the third buffer layer BF3, and the y-axis represents the measured duration value (sec) of the instantaneous afterimage of the display device.

The third buffer layer BF3 may be formed using a plasma generation gas containing fluorine using $SiF_4$ and $SiH_4$. The fluorine content in the third buffer layer BF3 can be controlled according to the flow rate ratio of $SiF_4$ and $SiH_4$.

When no fluorine is contained in the third buffer layer BF3 (Example 1), since the trap density is not controlled at the interface between the buffer layer BF and the semiconductor layer 121, the instantaneous afterimage duration of the display device was 13.8 sec.

When the fluorine content in the third buffer layer BF3 is 1.89 at % (Example 2), since the fluorine in the third buffer layer BF3 diffuses such that the trap density at the interface between the third buffer layer BF3 and the semiconductor layer 121 is reduced, the instantaneous afterimage duration of the display device was reduced by about 2.4 sec.

When the fluorine content in the third buffer layer BF3 is 2.27 at % (Example 3), the instantaneous afterimage duration of the display device was 14.3 sec, which was worse than Example 1. As the fluorine content in the third buffer layer BF3 is excessive, excess fluorine diffuses to the adjacent layer, thereby increasing the trap density at the interface between the third buffer layer BF3 and the semiconductor layer 121.

The experimental results indicate that the fluorine content in the third buffer layer BF3 is preferably controlled to be less than 2 at %.

In some embodiments, in addition to the third buffer layer BF3, the second buffer layer BF2 or the first buffer layer BF1 may further include fluorine. The fluorine of the second buffer layer BF2 or the first buffer layer BF1 may be fluorine which is intentionally added at the time of manufacturing. Alternatively or additionally, the fluorine contained in the third buffer layer BF3 may diffuse to the second buffer layer BF2 or the first buffer layer BF1. Even when fluorine is contained in the second buffer layer BF2 or the first buffer layer BF1, the fluorine content of each of the layers BF1 and BF2 may be less than the fluorine content in the third buffer layer BF3.

In embodiments, the stacking order of the first buffer layer BF1 and the second buffer layer BF2 may be changed, and/or at least one of the first buffer layer BF1 and the second buffer layer BF2 may be unnecessary.

Figure 6:
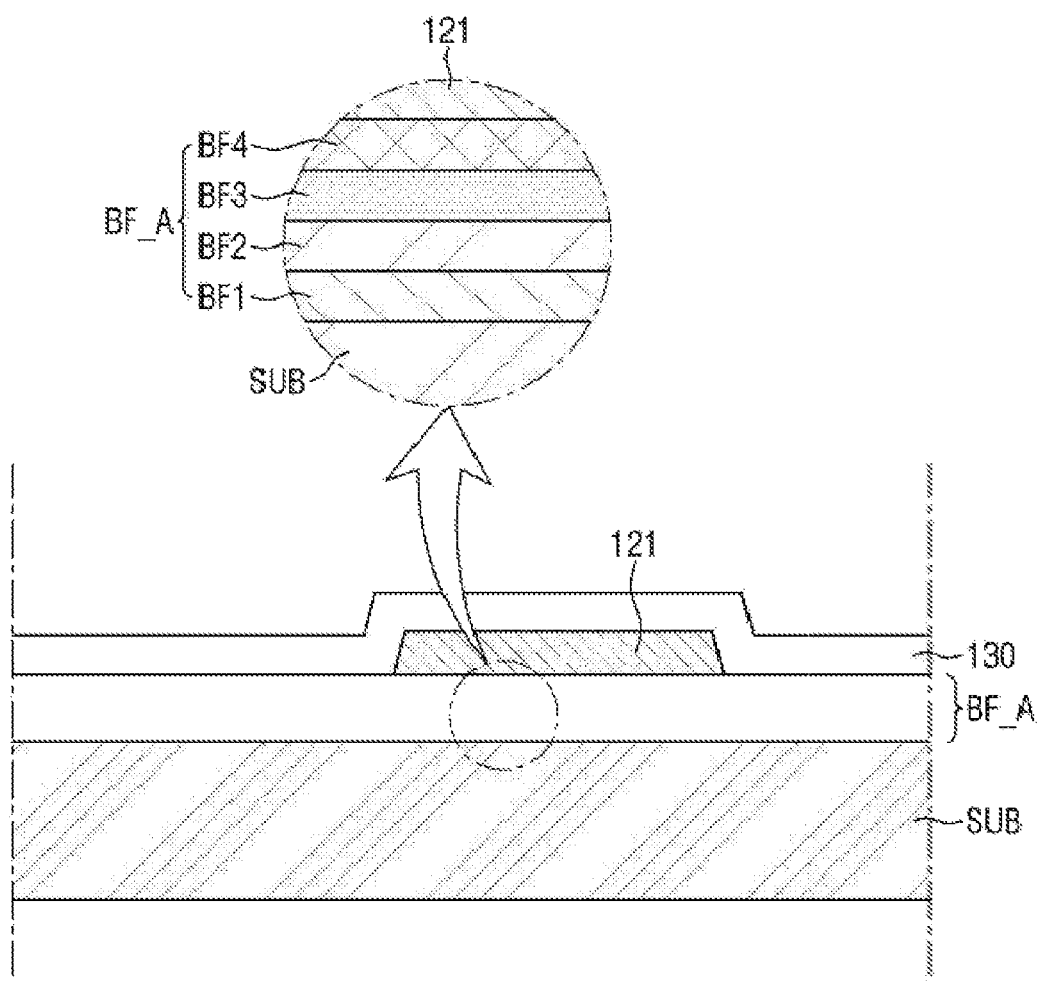
FIG. 6 is a cross-sectional view schematically showing a thin film transistor panel according to an embodiment.

FIG. 6 is a cross-sectional view schematically showing a thin film transistor panel according to an embodiment. Descriptions of above-described elements may not be repeated.

Referring to FIG. 6, a buffer layer BF_A includes the first buffer layer BF1, the second buffer layer BF2, the third buffer layer BF3, and a fourth buffer layer BF4 disposed on the third buffer layer BF3.

One surface of the fourth buffer layer BF4 may be in direct contact with one surface of the third buffer layer BF3 and the other surface of the fourth buffer layer BF4 may be in direct contact with one surface of the semiconductor layer 121.

The fourth buffer layer BF4 may include an inorganic material. In one embodiment, the fourth buffer layer BF4 may be a silicon oxide (SiOx) film, and crystallization of the semiconductor layer 121 can be facilitated using latent heat of the silicon oxide (SiOx) film.

The fourth buffer layer BF4 may be formed of substantially the same material as the second buffer layer BF2. A small amount of fluorine may be contained in the fourth buffer layer BF4. The fluorine content in the fourth buffer layer BF4 may be less than the fluorine content in the third buffer layer BF3 and may be larger than each of the fluorine content in the first buffer layer BF1 and the fluorine content in the second buffer layer BF2.

The fluorine contained in the fourth buffer layer BF4 may be fluorine having diffused from the third buffer layer BF3. As the fluorine contained in the third buffer layer BF3 diffuses into the fourth buffer layer BF4, a more stable Si—F bond may be formed instead of a Si—H bond at the interface between the fourth buffer layer BF4 and the semiconductor layer 121. Thus, the trap density is reduced, and an instantaneous afterimage phenomenon of a display device can be minimized ore prevented.

Since the fourth buffer layer BF4 is sandwiched between the third buffer layer BF3 and the semiconductor layer 121, even if the third buffer layer BF3 contains an excessive amount of fluorine, it is possible to prevent a defect at the interface between the semiconductor layer BF and the semiconductor layer 121 due to excessive fluorine.

Without the fourth buffer layer BF4, when fluorine contained in the third buffer layer BF3 is in an excessive amount, by-products such as hydrofluoric acid (HF) may be generated. This may cause degradation in display quality, such as an instantaneous afterimage of a display device. When the fourth buffer layer BF4 is disposed between the third buffer layer BF3 and the semiconductor layer 121, the fourth buffer layer BF4 can prevent the fluorine from excessively diffusing from the third buffer layer BF3 to the semiconductor layer 121. Accordingly, since the trap density at the interface between the fourth buffer layer BF4 and the semiconductor layer 121 can be controlled, it is possible to effectively prevent an interface defect between the buffer layer BF and the semiconductor layer 121.

The thickness of the fourth buffer layer BF4 may be configured according to the fluorine content in the third buffer layer BF3. It is preferable that the thickness of the fourth buffer layer BF4 is formed thicker as the fluorine content in the third buffer layer BF3 becomes larger. In one embodiment, the fourth buffer layer BF4 may be equal to the thickness of the second buffer layer BF2, or may be thinner than the second buffer layer BF2.

Figure 7:
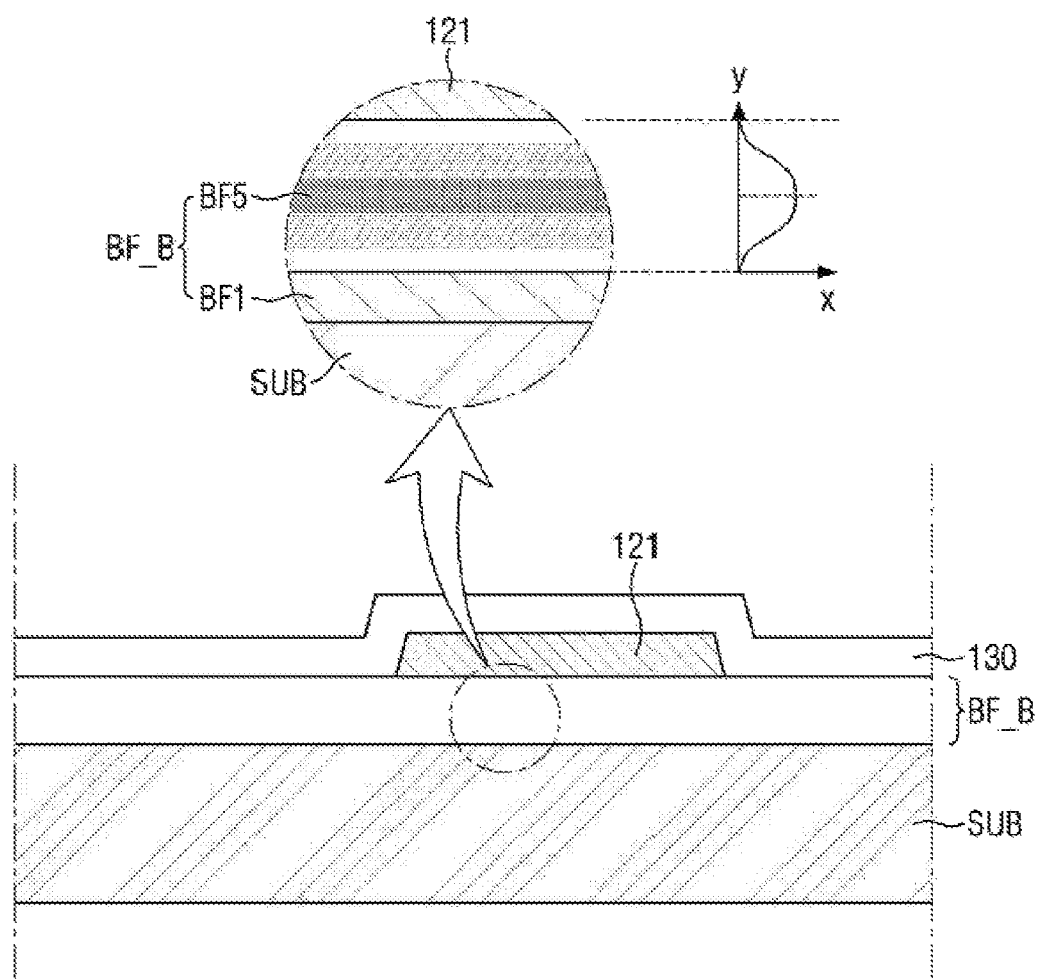
FIG. 7 is a cross-sectional view schematically showing a thin film transistor panel according to an embodiment.

FIG. 7 is a cross-sectional view schematically showing a thin film transistor panel according to an embodiment. Descriptions of above-described elements may not be repeated.

Referring to FIG. 7, the thin film transistor panel may include a buffer layer BF_B, which may include a first buffer layer BF1 and a fluorine-containing fifth buffer layer BF5. The first buffer layer BF1 may be disposed on a substrate SUB, the fifth buffer layer BF5 may be disposed on the first buffer layer BF1, and a semiconductor layer 121 may be disposed on the fifth buffer layer BF5. One surface of the fifth buffer layer BF5 may be in direct contact with one surface of the first buffer layer BF1, and another surface of the fifth buffer layer BF5 may be in direct contact with one surface of the semiconductor layer 121.

The fluorine concentration of the fifth buffer layer BF5 may vary depending on the vertical height/position along the thickness direction perpendicular to the substrate SUB from the substrate SUB to the semiconductor layer 121. The fluorine concentration of the fifth buffer layer BF5 may have a concentration gradient that increases toward the center of the fifth buffer layer BF5. The fluorine concentration in the fifth buffer layer BF5 at the same height from the substrate SUB may be constant.

In one embodiment, the fluorine concentration in the fifth buffer layer BF5 may be the maximum at the center level/plane of the fifth buffer layer BF5 between the substrate SUB and the semiconductor layer 121, and may gradually decrease from the center level/plane of the fifth buffer layer BF5 toward the substrate SUB and/or the semiconductor layer 121 in the thickness direction. The distribution of the fluorine concentration in the fifth buffer layer BF5 may be substantially symmetrical with respect to the center level/plane of the fifth buffer layer BF5. In embodiments, the fluorine concentration on the side of the fifth buffer layer BF5 that directly contacts the semiconductor layer 121 may be larger than the fluorine concentration on the side of the fifth buffer layer BF5 that directly contacts the substrate SUB.

Since the fluorine concentration in the fifth buffer layer BF5 has a concentration gradient increasing toward the center, the fluorine diffusion in the fifth buffer layer BF5 can be facilitated. Accordingly, the trap density at the interface between the fifth buffer layer BF5 and the semiconductor layer 121 can be more effectively controlled, and an instantaneous afterimage phenomenon of a display device can be minimized or prevented.

Since fluorine diffuses from the center of the fifth buffer layer BF5, it is possible to prevent excessive fluorine from reaching the interface between the fifth buffer layer BF5 and the semiconductor layer 121.

The fluorine concentration of the fifth buffer layer BF5 may be formed in a continuous process by controlling the concentration of the fluorine gas during the formation of the fifth buffer layer BF5. Accordingly, the process can be simplified, and related economic efficiency can be secured.

Figure 8:
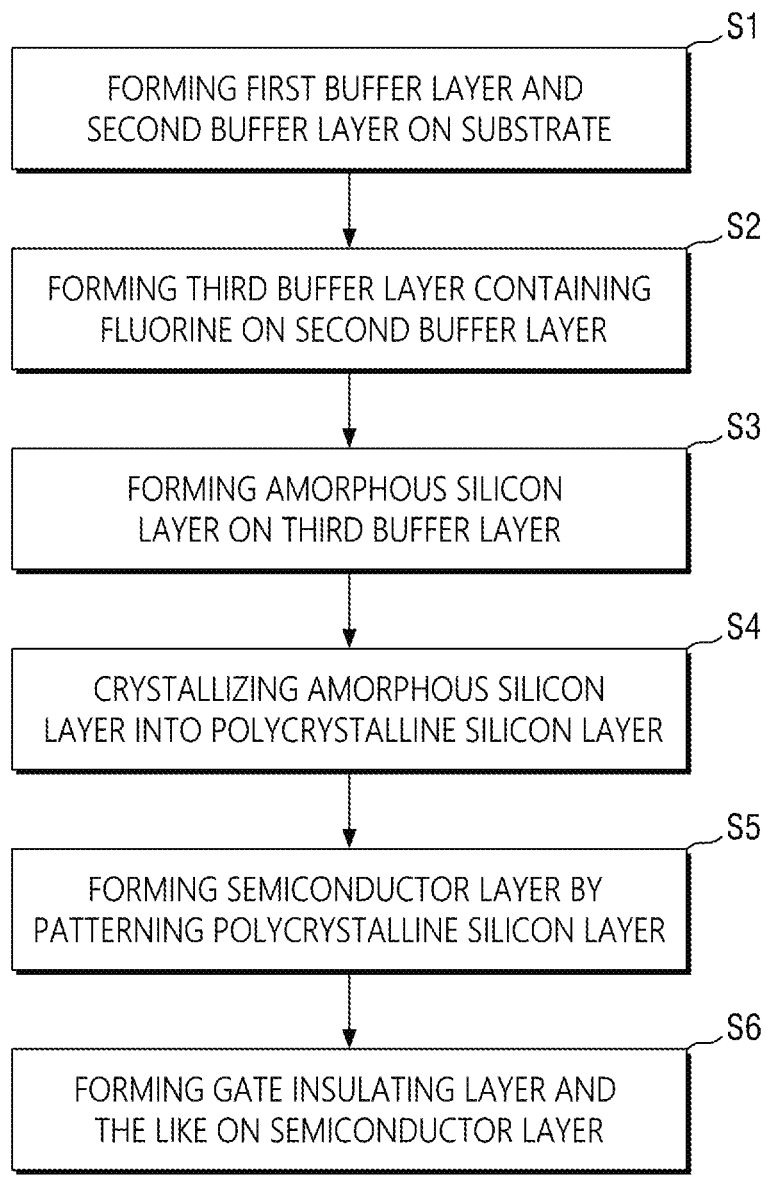
FIG. 8 is a flowchart showing steps of a method of manufacturing a thin film transistor panel according to an embodiment.

FIG. 8 is a flowchart showing steps of a method of manufacturing a thin film transistor panel according to an embodiment. FIGS. 9 to 14 are cross-sectional views illustrating structures formed in a method of manufacturing the thin film transistor panel according to an embodiment. The thin film transistor may include elements illustrated in FIG. 3 and/or FIG. 4.

Referring to FIGS. 8 to 14, the method of manufacturing a thin film transistor panel may include preparing a substrate SUB and forming a first buffer layer BF1 and a second buffer layer BF2 on the substrate SUB (S1), forming a fluorine-containing third buffer layer BF3 on the second buffer layer BF2 (S2), forming an amorphous silicon layer 121A on the third buffer layer BF3 (S3), crystallizing the amorphous silicon layer 121A into a polycrystalline silicon layer 121P (S4), forming a semiconductor layer 121 by patterning the polycrystalline silicon layer 121P (S5), and forming a gate insulating layer 130 and the like on the semiconductor layer 121 (S6).

Figure 9:
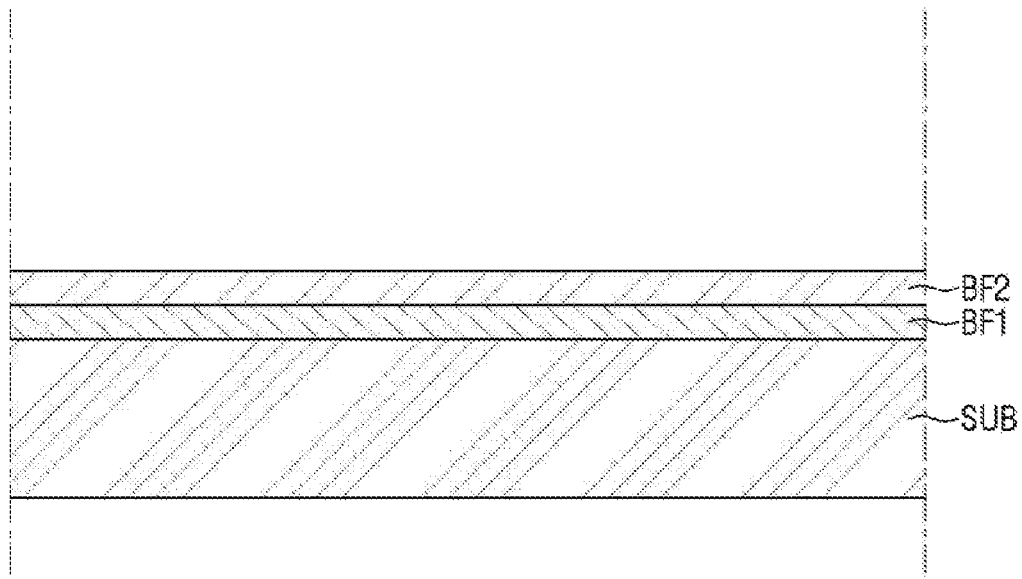
FIG. 9, FIG. 10, FIG. 11, FIG. 12, FIG. 13, and FIG. 14 are cross-sectional views illustrating structures formed in a method of manufacturing a thin film transistor panel according to an embodiment.

Referring to FIGS. 8 and 9, the method includes preparing a substrate SUB and forming a first buffer layer BF1 and a second buffer layer BF2 on the substrate SUB (S1). The first buffer layer BF1 and the second buffer layer BF2 may be formed by, for example, plasma enhanced chemical vapor deposition (PECVD), and the characteristics of the first buffer layer BF1 and the second buffer layer BF2 may be configured by controlling a ratio of the gases used. The first buffer layer BF1 is formed of a silicon nitride (SiNx), and the second buffer layer BF2 is formed of a silicon oxide (SiOx).

Figure 10:
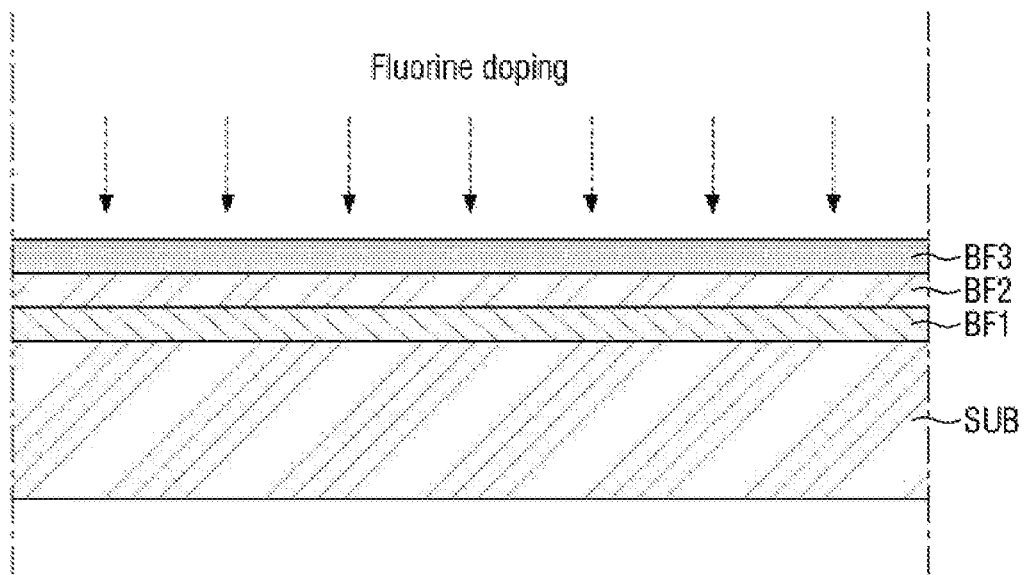

Then, referring to FIGS. 8 and 10, a third buffer layer BF3 containing fluorine is formed on the second buffer layer BF2 (S2). The third buffer layer BF3 may be an inorganic film formed of SiOF and/or SiNF, and may be formed by plasma enhanced chemical vapor deposition (PECVD). In one embodiment, the third buffer layer BF3 may be formed of SiOF by injecting a fluorine doping gas into the SiOx film.

The fluorine injection step may be performed using a fluorine-containing plasma-generating gas containing $SiF_4$ and $SiH_4$, in a PECVD apparatus. The fluorine content in the third buffer layer BF3 can be controlled by controlling a flow rate ratio of the $SiF_4$ and the $SiH_4$.

In one embodiment, after the silicon oxide second buffer layer BF2 is formed, a SiOF layer, which is the third buffer layer BF3, may be continuously formed by controlling the flow rate of $SiF_4$ in a plasma gas (and stopping the supply of $SiH_4$). Since the second buffer layer BF2 and the third buffer layer BF3 can be continuously formed, the process steps can be simplified, thereby ensuring related economic efficiency.

Figure 11:
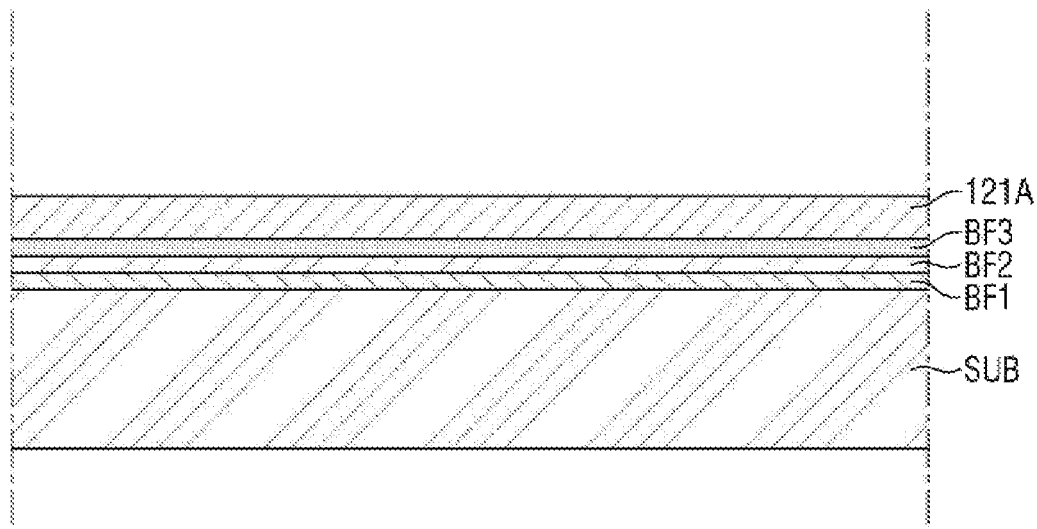

Then, referring to FIGS. 8 and 11, an amorphous silicon layer 121A is formed on the third buffer layer BF3 (S3). The amorphous silicon layer 121A may be formed by at least one of various deposition methods, such as plasma enhanced chemical vapor deposition (PECVD), atmospheric pressure CVD (APCVD), and/or low pressure CVD (LPCVD).

Figure 12:
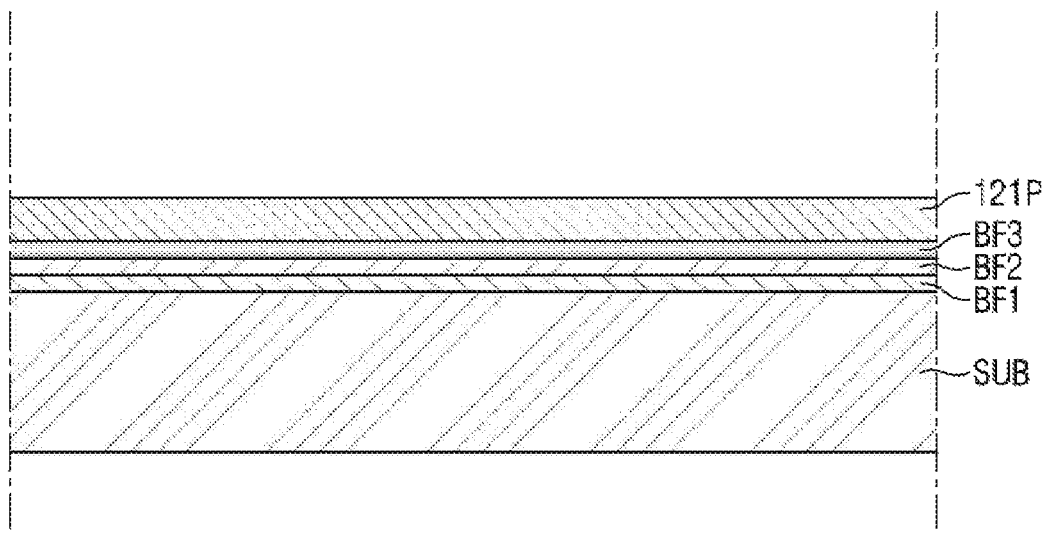

Then, referring to FIGS. 8 and 12, the amorphous silicon layer 121A is crystallized into a polycrystalline silicon layer 121P (S4). In a low-temperature heat treatment process, laser annealing is useful for manufacturing a semiconductor thin film of a thin film transistor because heat treatment is performed only on the surface to be irradiated. The laser annealing process can be performed at a temperature in a range of 300° C. to 600° C. By irradiating an amorphous silicon thin film with an excimer laser having an high energy density, the amorphous silicon thin film is melted and crystallized to obtain a low-temperature polycrystalline silicon (LTPS) thin film. When the amorphous silicon thin film is melted into a liquid state by the excimer laser irradiation and solidified into a solid state, since the silicon atoms are rearranged into a grain shape having excellent crystallinity, the electrical characteristics of the low-temperature polycrystalline silicon (LTPS) thin film fabricated using the excimer laser may be superior to those of a polycrystalline silicon thin film fabricated by an alternative heat treatment method. Without the fluorine-containing third buffer layer BF3, the heat of the laser may cause deformation of the substrate SUB disposed under the semiconductor layer 121, and charge trapping may occur at the interface of the buffer layer BF in contact with the semiconductor layer 121.

In an embodiment, the third buffer layer BF3 contains fluorine and the diffusion of fluorine in the third buffer layer BF3 is promoted by the heat of the excimer laser, so that the distribution of fluorine can be more concentrated on the interface between the third buffer layer BF3 and the amorphous silicon layer 121A. Accordingly, a Si—F bond may be formed instead of a Si-H bond at the interface between the third buffer layer BF3 and the amorphous silicon layer 121A. As a relatively weak Si—H bond is replaced by a more stable Si—F bond, the number of trap sites at the interface between the third buffer layer BF3 and the amorphous silicon layer 121A can be reduced.

Since the number of trap sites can be reduced, electron mobility can be improved. As a result, an instantaneous afterimage phenomenon of the display device may be minimized or prevented.

Figure 13:
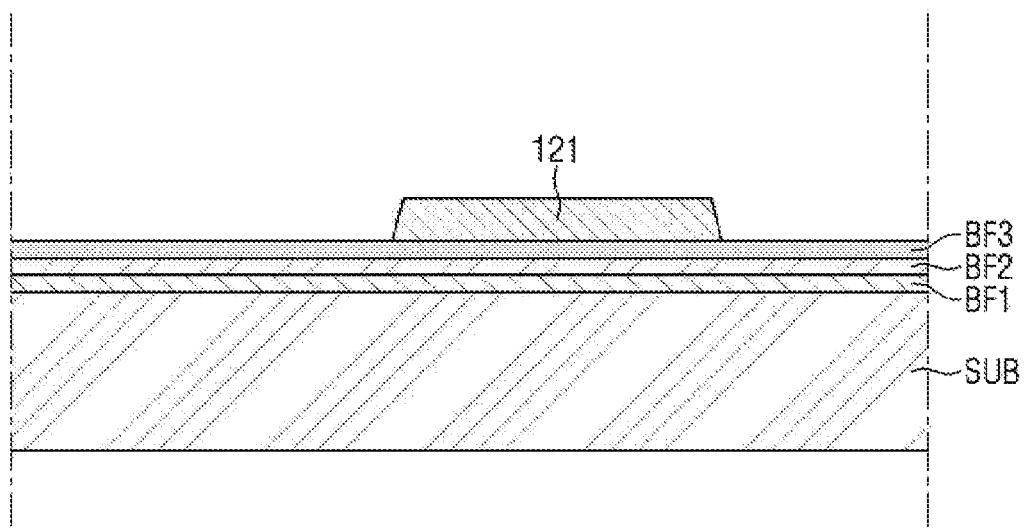

Then, referring to FIGS. 8 and 13, the polycrystalline silicon layer 121P is patterned (i.e., partially removed) to form the semiconductor layer 121 (S5). The patterning process may be performed by a photolithography process.

Figure 14:
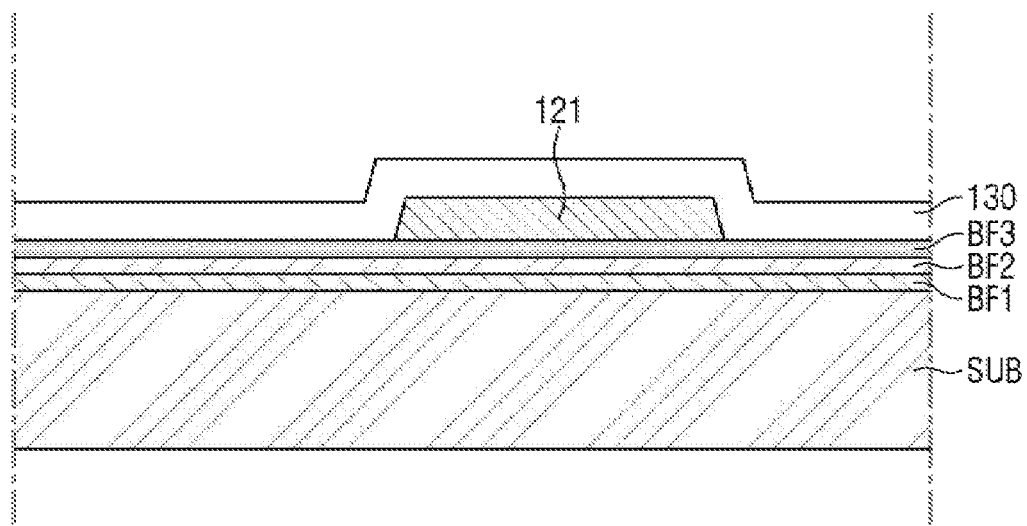

Then, referring to FIGS. 8 and 14, the gate insulating layer 130 is formed on the semiconductor layer 121 (S6).

Although not shown in FIG. 14, a gate electrode 122, an interlayer insulating film 140, a source electrode 123, a drain electrode 124, a passivation layer 150, a planarization layer 160, a light emitting element 170, a pixel defining layer 180, and the like are further formed to constitute a display device described with reference to FIG. 3.

Although example embodiments have been disclosed for illustrative purposes, various modifications, additions, and substitutions are possible without departing from the scope defined in the accompanying claims.

What is claimed is:
1. A transistor panel comprising:
   a substrate;
   a transistor overlapping the substrate and comprising a semiconductor layer;
   a first inorganic buffer layer disposed between the substrate and the semiconductor layer;
   an inorganic fluorine-containing buffer layer disposed between the first inorganic buffer layer and the semiconductor layer, directly contacting the semiconductor layer, and containing fluorine in a range of 0.5 at % to 2 at %; and
   a second inorganic buffer layer interposed between the first inorganic buffer layer and the inorganic fluorine-containing buffer layer,
   wherein at least one of the first inorganic buffer layer and the second inorganic buffer layer contains fluorine, and
   wherein each of a content of fluorine contained in the first inorganic buffer layer and a content of fluorine contained in the second inorganic buffer layer is less than a content of fluorine contained in the inorganic fluorine-containing buffer layer.

2. The transistor panel of claim 1, wherein the first inorganic buffer layer includes a silicon nitride film.

3. The transistor panel of claim 2, wherein the second inorganic buffer layer includes a silicon oxide film.

4. The transistor panel of claim 3, wherein the first inorganic buffer layer is disposed directly on one surface of the substrate.

5. A transistor panel comprising:
a substrate;
a transistor overlapping the substrate and comprising a semiconductor layer;
a first inorganic buffer layer disposed between the substrate and the semiconductor layer; and
an inorganic fluorine-containing buffer layer disposed between the first inorganic buffer layer and the semiconductor layer, directly contacting the semiconductor layer, and containing fluorine in a range of 0.5 at % to 2 at %, wherein a concentration of the fluorine in the inorganic fluorine-containing buffer layer decreases from a center of the inorganic fluorine-containing buffer layer toward at least one of the substrate and the semiconductor layer in a thickness direction.

6. The transistor panel of claim 1, wherein the inorganic fluorine-containing buffer layer includes SiOF or SiNF.

7. The transistor panel of claim 1, wherein the semiconductor layer includes polycrystalline silicon.

8. The transistor panel of claim 1, wherein the substrate includes glass containing an alkali metal oxide component.

9. A display device comprising:
a substrate;
a silicon nitride film disposed on the substrate;
a first silicon oxide film disposed on the silicon nitride film;
a fluorine-containing inorganic film disposed on the first silicon oxide film, containing fluorine in a range of 0.5 at % to 2 at %, and including SiOF or SiNF; and
a silicon film disposed directly on the fluorine-containing inorganic film, wherein the fluorine-containing inorganic film is disposed between the silicon film and the first silicon oxide film,
wherein at least one of the silicon nitride film and the first silicon oxide film contains fluorine, and
wherein each of a content of fluorine contained in the silicon nitride film and a content of fluorine contained in the first silicon oxide film is less than a content of fluorine contained in the fluorine-containing inorganic film.

10. The display device of claim 9, wherein the silicon film includes polycrystalline silicon, and wherein the substrate includes glass containing an alkali metal oxide component.

11. The display device of claim 9, wherein among the silicon nitride film, the first silicon oxide film, and the fluorine-containing inorganic film, the fluorine-containing inorganic film has a maximum content of fluorine.

12. A method of manufacturing a thin film transistor panel, the method comprising:
forming a first inorganic buffer layer on a substrate;
forming an inorganic fluorine-containing buffer layer on the first inorganic buffer layer, wherein the inorganic fluorine-containing buffer layer contains fluorine in a range of 0.5 at % to 2 at %;
forming a semiconductor layer directly on the inorganic fluorine-containing buffer layer; and
forming a second inorganic buffer layer after forming the first inorganic buffer layer and before forming the inorganic fluorine-containing buffer layer,
wherein the inorganic fluorine-containing buffer layer is disposed between the second inorganic buffer layer and the semiconductor layer,
wherein at least one of the first inorganic buffer layer and the second inorganic buffer layer contains fluorine, and
wherein each of a content of fluorine contained in the first inorganic buffer layer and a content of fluorine contained in the second inorganic buffer layer is less than a content of fluorine contained in the inorganic fluorine-containing buffer layer.

13. The method of claim 12, wherein the first inorganic buffer layer includes a silicon nitride film, and wherein the second inorganic buffer layer includes a silicon oxide film.

14. The method of claim 13, wherein the step of forming the inorganic fluorine-containing buffer layer comprises forming a film using a reaction gas containing $SiF_4$ and $SiH_4$.

15. The method of claim 14, wherein the step of forming the second inorganic buffer layer and the step of forming the inorganic fluorine-containing buffer layer are performed in the same chamber.

16. The method of claim 12, wherein the step of forming the semiconductor layer comprises: forming an amorphous silicon layer on the inorganic fluorine-containing buffer layer, and crystallizing the amorphous silicon layer to form a polycrystalline silicon layer.

* * * * *